United States Patent
Lee et al.

[11] Patent Number: 5,918,135
[45] Date of Patent: Jun. 29, 1999

[54] METHODS FOR FORMING INTEGRATED CIRCUIT CAPACITORS INCLUDING DUAL ELECTRODE DEPOSITIONS

[75] Inventors: Ki-Young Lee, Kyungki-do; Kwang-Dong Yoo, Seoul, both of Rep. of Korea

[73] Assignee: Samsung Electronics Co., Ltd., Rep. of Korea

[21] Appl. No.: 08/867,070

[22] Filed: Jun. 2, 1997

[30] Foreign Application Priority Data

Jan. 7, 1997 [KR] Rep. of Korea ............... 97-195

[51] Int. Cl.[6] .................................................. H01L 21/20
[52] U.S. Cl. ............................................. 438/393; 438/250
[58] Field of Search ................................... 438/253, 396, 438/393, 250; 257/296, 306

[56] References Cited

U.S. PATENT DOCUMENTS

| | | | |
|---|---|---|---|
| 4,481,283 | 11/1984 | Kerr et al. | 438/396 |
| 4,971,924 | 11/1990 | Tigelaar et al. | 438/396 |
| 5,227,323 | 7/1993 | Nishitsuji et al. | 438/396 |
| 5,563,762 | 10/1996 | Leung et al. | 361/301.4 |
| 5,571,746 | 11/1996 | Pan | 438/396 |
| 5,576,240 | 11/1996 | Radosevich et al. | 438/396 |
| 5,610,101 | 3/1997 | Koyama | 438/253 |
| 5,658,821 | 8/1997 | Chen et al. | 438/396 |
| 5,674,771 | 10/1997 | Machida et al. | 438/396 |
| 5,744,387 | 4/1998 | Tseng | 438/438 |
| 5,753,527 | 5/1998 | Itoh et al. | 438/396 |

FOREIGN PATENT DOCUMENTS 5-299581  11/1993  Japan .

*Primary Examiner*—Peter Toby Brown
*Assistant Examiner*—Toniae M. Thomas
*Attorney, Agent, or Firm*—Myers Bigel Sibley & Sajovec

[57] ABSTRACT

A method for forming an integrated circuit device includes the steps of forming a first capacitor electrode on a substrate and forming a first wiring electrode on the substrate. An insulating layer is formed on the first capacitor electrode and on the first wiring electrode opposite the substrate. A second capacitor electrode is formed on a portion of the insulating layer opposite the first capacitor electrode. A contact hole is formed in the insulating layer exposing a portion of the first wiring electrode. A second wiring electrode is then formed on the exposed portion of the wiring electrode, after forming the second capacitor electrode. Related structures are also discussed.

20 Claims, 5 Drawing Sheets

METHODS FOR FORMING INTEGRATED CIRCUIT CAPACITORS INCLUDING DUAL ELECTRODE DEPOSITIONS

FIELD OF THE INVENTION

The present invention is related to the field of integrated circuits and more particularly to methods for forming integrated circuit capacitors.

BACKGROUND OF THE INVENTION

Capacitor structures for semiconductor integrated circuits include metal-oxide-semiconductor (MOS) capacitors, PN junction capacitors, and polysilicon-insulator-polysilicon (PIP) capacitors. Each of these capacitor structures includes at least one monocrystalline silicon layer or polycrystalline silicon layer which is used as a capacitor electrode. The use of silicon for the capacitor electrode, however, may result in a higher electrode resistance than is desired.

It is thus desirable to reduce the resistance of capacitor electrodes to decrease frequency dependence of the capacitor. Accordingly, metal-insulator-metal (MIM) thin film capacitors have been developed to provide low electrode resistances. Accordingly, metal-insulator-metal capacitors can be used in integrated circuits requiring high speed performance. In addition, metal-insulator-metal thin film capacitors have been applied to advanced analog semiconductor devices because these capacitors have capacitance fluctuation rates dependent on voltage and temperature which are sufficiently low to provide desirable electrical characteristics.

In addition, there have been efforts to reduce thicknesses of dielectric layers for integrated circuit capacitors to thereby increase the performance of capacitors including these thinner dielectric layers. In particular, the capacitance of a capacitor can be increased by reducing the thickness of the dielectric layer between the two capacitor electrodes. There have also been efforts to increase capacitances by using dielectric layers having relatively high dielectric constants, and by increasing the surface areas of the capacitor electrodes. Furthermore, multi-wiring processes have been applied to semiconductor manufacturing methods to facilitate the development of high-density integration and micro-technology. Accordingly, metal--insulator-metal thin film capacitors can be manufactured together with multi-wiring structures.

FIGS. 1 through 4 are cross-sectional views illustrating steps of a method for forming a metal-insulator-metal thin film capacitor in accordance with a multi-wiring structure. As shown in FIG. 1, an insulating layer 10 is formed on a microelectronic substrate 9. This insulating layer insulates and protects structures formed in and on the microelectronic substrate. In addition, contact holes in the insulating layer 10 can provide contact with portions of the structures previously formed in the microelectronic substrate. An aluminum layer is then formed on the insulating layer 10, and a titanium nitride (TiN) layer is formed on the aluminum layer opposite the insulating layer 10. In particular, the titanium nitride layer can reduce the formation of aluminum hillocks on the aluminum layer. The aluminum and titanium nitride layers are then patterned using photolithography and etch steps to form the first wiring layer 12b, the lower capacitor electrode 12a, and the conductive layer 14 thereon. In particular, the first-wiring layer 12b can be used to provide connections between the lower capacitor electrode 12a and other elements of the integrated circuit device.

As shown in FIG. 2, a second insulating layer 16 is deposited on the lower capacitor electrode 12a, the first-wiring layer 12b, the conductive layer 14, and the first insulating layer 10. The insulating layer 16 and the conductive layer 14 are then patterned to provide a contact hole 18 exposing a portion of the lower capacitor electrode 12a opposite the first insulating layer 10. In particular, the contact hole can be formed using photolithography and etch steps.

As shown in FIG. 3, a silicon oxide layer is deposited on the surface of the insulating layer 16 and the exposed portion of the lower capacitor electrode 12a using a chemical vapor deposition (CVD) step. This silicon oxide layer provides a dielectric layer 20 for the MIM capacitor. The insulating layer 16 and the dielectric layer 20 are then patterned to form the second contact hole 24 exposing a portion of the first wiring layer 12b opposite the first insulating layer 10. The second contact hole 24 can be formed using photolithography and etch steps.

A sputter etching step is then used to remove undesired materials (contaminants or pollutants) such as natural oxides from the exposed portion of the first wiring layer 12b, as shown in FIG. 4. An aluminum layer is then deposited and patterned to provide the upper capacitor electrode 26a and the second electrode wiring layer 26b. In particular, a continuous aluminum layer can be deposited and then patterned using photolithography and etch steps. The dielectric layer 20, however, is exposed during the sputter etching step. Accordingly, partial etching of the dielectric layer 20 may result in damage thereto as indicated by reference number 28 in FIG. 4. The homogeneity of the dielectric layer 20 may thus be reduced, and in severe cases, current leakage paths may be formed between the two capacitor electrodes.

To reduce the effects of damage to the dielectric layer 20, structures have been formed including dielectric layers with thickness of more than 1,000 Angstroms. In particular, the Japanese Patent Laid-Open No. 5-299581 includes a dielectric oxide layer with a 1,300 Angstrom thickness. The capacitance per unit area of a capacitor including such a thick dielectric layer may be reduced. Accordingly, conventional thin film capacitors may be unable to provide the speed and capacitance desired for many integrated circuit devices. Thinner dielectric layers may be unable to provide the desired performance when formed using a multi-wiring process.

SUMMARY OF THE INVENTION

It is therefore an object of the present invention to provide improved methods for forming integrated circuit capacitors and related structures.

It is another object of the present invention to provide methods for forming capacitors having relatively thin dielectric layers and related structures.

It is still another object of the present invention to provide methods for forming capacitors having reduced leakage current and related structures.

These and other objects are provided according to the present invention by methods including the steps of forming a first capacitor electrode on a substrate, and forming a first wiring electrode on the substrate. An insulating layer is formed on the first capacitor electrode and on the first wiring electrode opposite the substrate, and a second capacitor electrode is formed on a portion of the insulating layer opposite the first capacitor electrode. A contact hole is formed in the insulating layer exposing a portion of the first wiring electrode. After forming the second capacitor electrode, a second wiring electrode is then formed on the exposed portion of the first wiring electrode. More particularly, the step of forming the second wiring electrode can be preceded by the step of removing a natural oxide from the exposed portion of the first wiring electrode. Accordingly, a portion of the insulating layer on the first capacitor electrode can be protected by the second capacitor electrode when removing the natural oxides. The portion of the insulating layer between the two capacitor electrodes can thus be made thinner thereby increasing a capacitance per unit area for the capacitor thus formed.

In particular, the step of removing the natural oxide can be accomplished by sputter etching using an inert gas such as argon. In addition, the steps of forming the first capacitor electrode and forming the first wiring electrode can be performed simultaneously. In other words, a single metallic layer can be deposited and patterned to provide the first capacitor electrode and the first wiring electrode.

The step of forming the second wiring electrode can further include simultaneously forming a protective layer on the second capacitor electrode opposite the insulating layer. The method can also include the step of forming conductive layers on the second wiring layer and the protective layer. For example, the conductive layers can be titanium nitride layers used to reduce hillocks. Titanium nitride layers can also be formed on the first capacitor electrode and on the first wiring electrode.

The step of forming the insulating layer can include forming a first insulating sub-layer on the first capacitor electrode and on the first wiring electrode opposite the substrate, forming a contact hole in the first insulating sub-layer exposing a portion of the first capacitor electrode, and forming a second insulating sub-layer on the exposed portion of the first capacitor electrode. In particular, the second insulating sub-layer can have a thickness in the range of 500 Angstroms to 1,000 Angstroms, and the second insulating sub-layer can include materials such as silicon oxide or silicon nitride.

According to an alternate aspect of the present invention, an integrated circuit device includes a first capacitor electrode on a substrate and a first wiring electrode on the substrate. An insulating layer is provided on the first capacitor electrode and on the first wiring electrode opposite the substrate wherein the insulating layer has a contact hole there-in exposing a portion of the first wiring electrode. A second capacitor electrode is provided on a portion of the insulating layer opposite the first capacitor electrode. A second wiring electrode is provided on the exposed portion of the first wiring electrode.

According to the methods and structures of the present invention, integrated circuit capacitors can be provided with dielectric layers having reduced thickness and increased uniformity. Accordingly, performance for the capacitor can be increased. More particularly, the capacitance per unit area can be increased while decreasing leakage currents.

DETAILED DESCRIPTION

Figure 1:
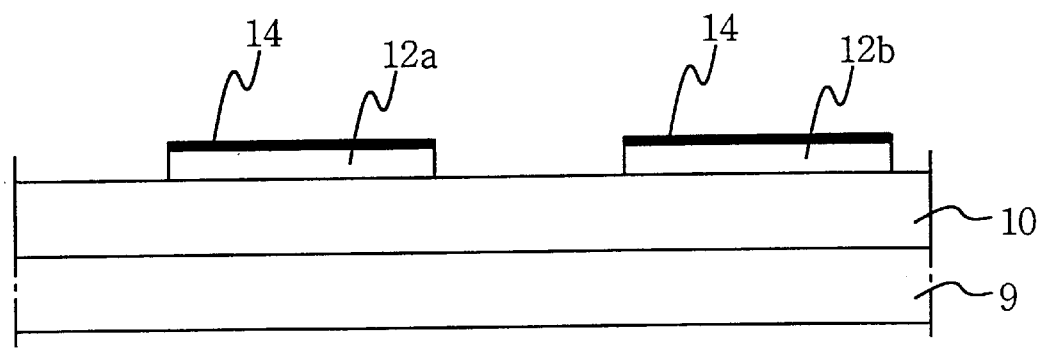
FIGS. 1 through 4 are cross sectional views illustrating steps of a method for forming a thin film capacitor according to the prior art.
Figure 2:
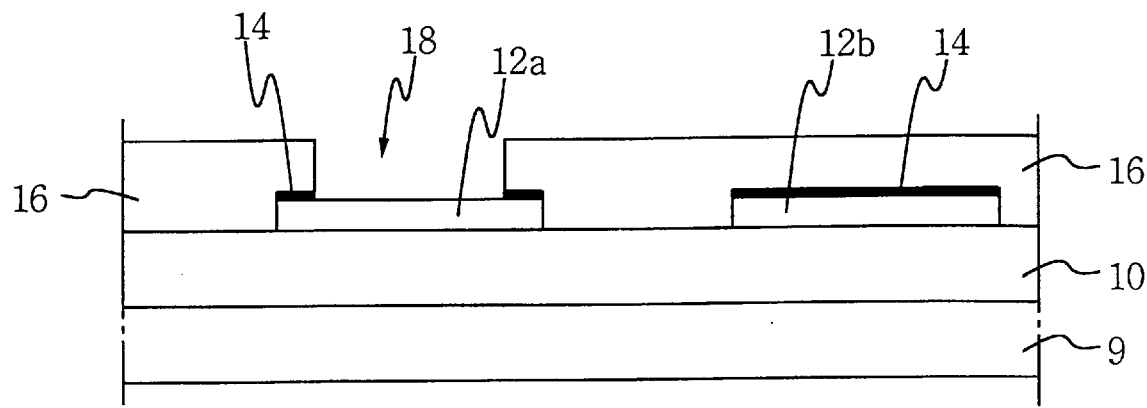
Figure 3:
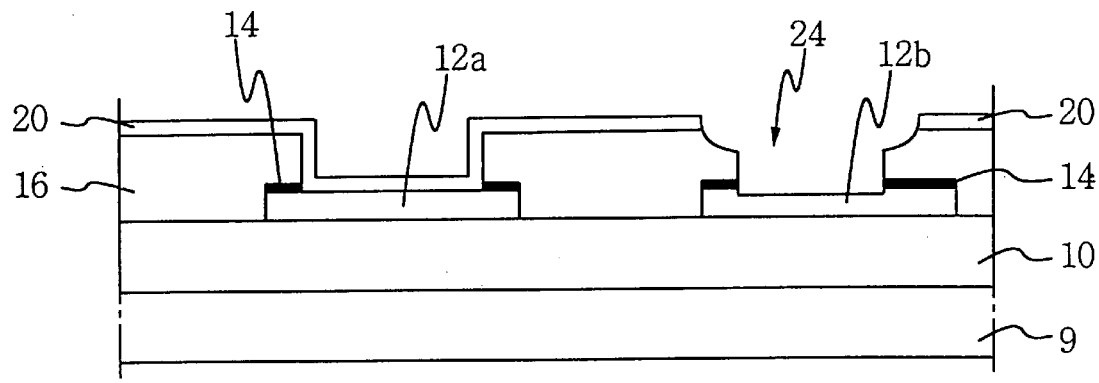
Figure 4:
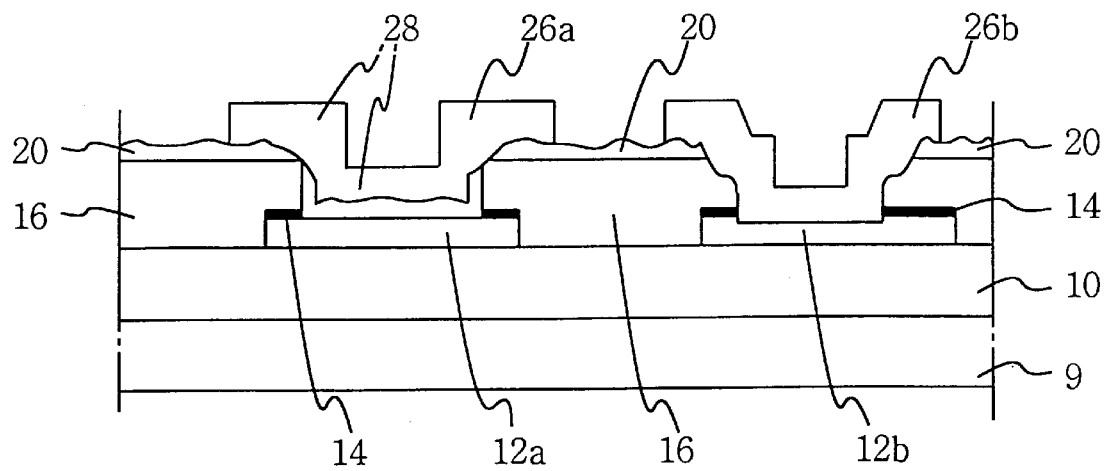

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

Figure 5:
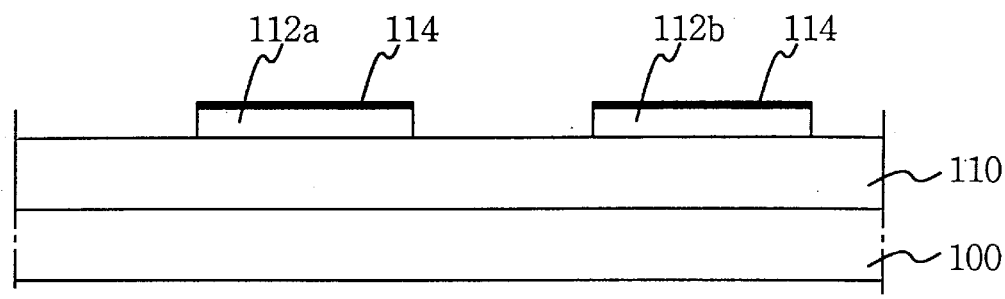
FIGS. 5 through 9 are cross sectional views illustrating steps of a method for forming a thin film capacitor according to the present invention.
Figure 6:
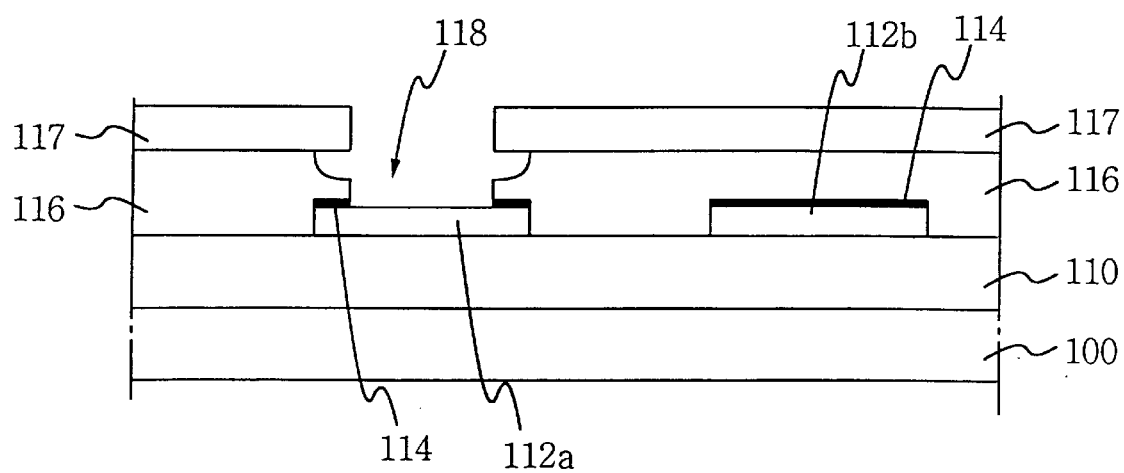
Figure 7:
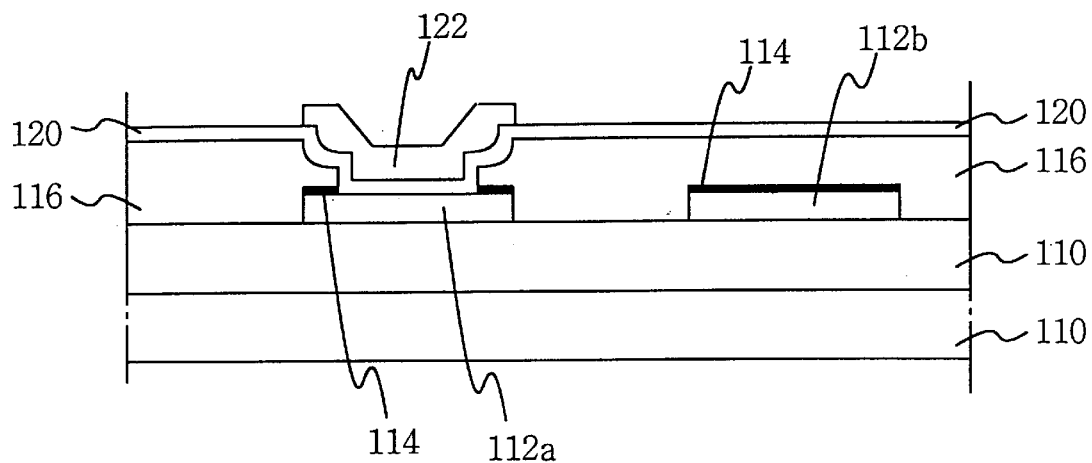

FIGS. 5 through 9 are cross-sectional views illustrating steps of a method for forming a metal-insulator-metal (MIM) thin film capacitor according to the present invention. As shown in FIG. 5, an insulating layer 110 is formed on a silicon substrate 100 so that various structures formed on the substrate can be insulated and protected. In addition, contact holes can be provided in the insulating layer 110 thus exposing portions of the substrate. The insulating layer 110 can include materials such as high temperature oxide (HTO), or borophosphosilicate glass (BPSG).

A metallic layer of aluminum or an aluminum alloy is then deposited on the insulating layer 110, and a titanium nitride layer is then formed on the metallic layer. The titanium nitride layer reduces hillocks on the metallic layer. The metallic layer and the titanium nitride layer are then patterned using photolithographic and etching steps to form the first wiring electrode 112b, the lower capacitor electrode 112a, and the conductive layer 114 thereon.

An insulating layer 116 is then formed on the capacitor lower electrode 112a, the first wiring electrode 112b, and the first insulating layer 110. The second insulating layer 116 can be formed with low temperature oxide (LTO) or spin-on-glass (SOG). A first photoresist pattern 117 is formed on the second insulating layer 116 to provide an etching mask. The second insulating layer 116 is then patterned by etching exposed portions thereof thus exposing a portion of the lower capacitor electrode 112a opposite the first insulating layer 110. Accordingly, the contact hole 118 is formed in the insulating layer 116 exposing the lower capacitor electrode 112a. The second insulating layer 116 can be etched using a combination of wet and dry etch steps. For example, a first wet etch step can be followed by a second dry etch step. Alternately, a dry etch can be used without the wet etch.

The first photoresist pattern 117 is then removed, and a dielectric layer 120 is formed on the second insulating layer 116 and the exposed portion of the lower capacitor electrode 112a. In particular, the dielectric layer 120 can be a silicon oxide layer or a silicon nitride layer formed using a chemical vapor deposition (CVD) step. The dielectric layer 120 can have a thickness in the range of 500 Angstroms to 1,000 Angstroms. The upper capacitor electrode 122 is then formed on the dielectric layer 120 opposite the exposed portion of the lower capacitor electrode 112a. The upper capacitor electrode 122 can be formed from a metal such as aluminum, an aluminum alloy, copper, or a copper alloy with a thickness in the range of 500 Angstroms to 6,000 Angstroms. Moreover, the upper capacitor electrode 122 can be formed by a depositing a continuous layer of metal which is then patterned using photolithography and etch steps. It is preferred that the thickness of the upper capacitor electrode 122 be controlled to reduce step differences with respect to the silicon substrate. Accordingly, the upper capacitor electrode 122 is preferably no thicker than the lower capacitor electrode 112a and a second wiring electrode 126b.

Figure 8:
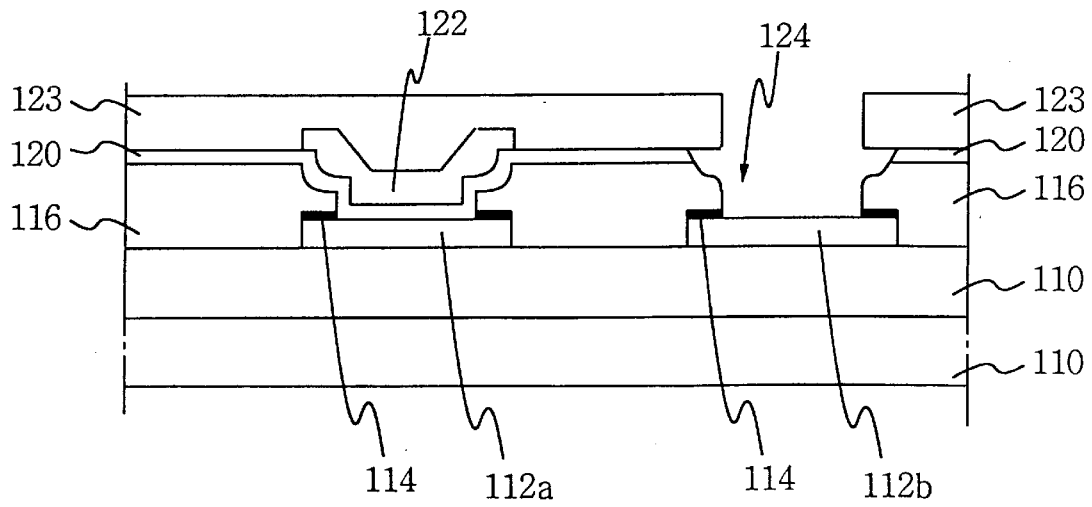

A second photoresist pattern 123 is formed on the dielectric layer 120 and the upper capacitor electrode 122 as shown in FIG. 8. The second photoresist pattern 123 exposes a portion of the dielectric layer 120 opposite the first wiring electrode 112b. The dielectric layer 120 and the insulating layer 116 are then etched using the photoresist pattern 123 as a mask to form a second contact hole 124 exposing portions of the first wiring electrode 112b opposite the first insulating layer 110. As discussed above with regard to FIG. 6, the contact hole 124 can be formed using a combination of wet and dry etch steps. For example, a first wet etch step can be followed by a second dry etch step. Alternately, a dry etch step can be used without a wet etch step. By first performing the wet etch step and then performing the dry etch step, as described above, an area of the contact hole 124 can be widened, so that when subsequently forming the second wiring electrode 126b, step coverage can be improved.

Figure 9:
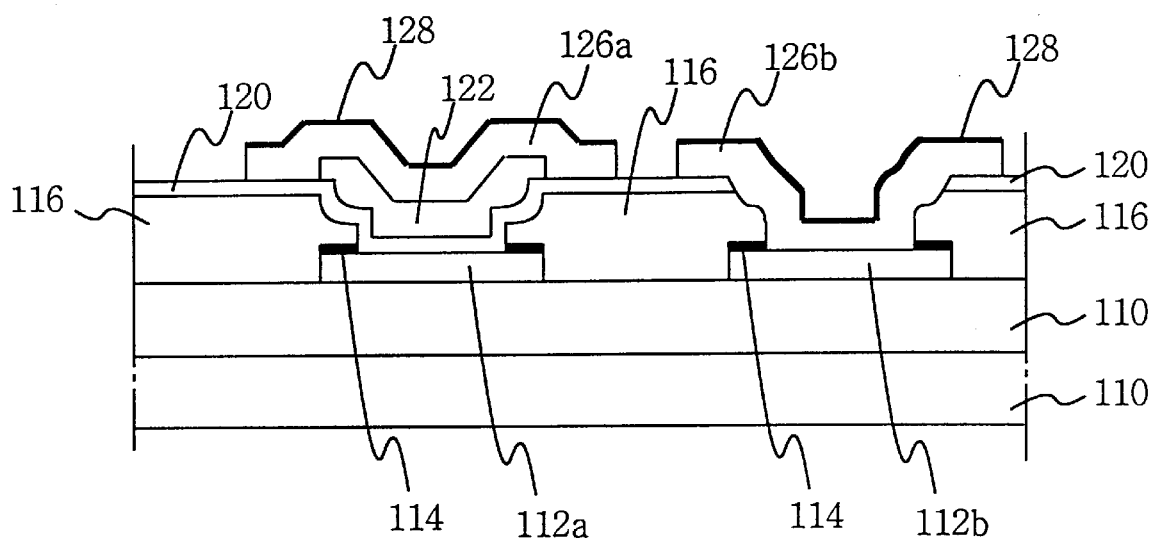

The second photoresist pattern 123 is removed, and the second wiring electrode 126b is formed as shown in FIG. 9. In particular, a sputter etch step using an inert gas such as ionized argon can be used to remove undesired materials (contaminants or pollutants) such as natural oxides from the exposed portions of the first wiring electrode 112b after removing the photoresist pattern 123. Accordingly, the resistance between the first wiring electrode 112b and the second wiring electrode 126b can be reduced.

According to the methods of the present invention, the portions of the dielectric layer 120 on the first capacitor electrode 112a are protected by the second capacitor electrode 122 during the step of sputter etching the first wiring layer 112b. The uniformity of the dielectric layer 120 on the first capacitor electrode 112a can thus be improved thereby reducing leakage current for the capacitor. As discussed in the background of the invention, prior art methods for forming metal-insulator-metal capacitors may result in undesired etching of the dielectric layer between the two capacitor electrodes thereby resulting in leakage current. Accordingly, prior art capacitors are typically formed with a dielectric layer of over 1,000 Angstroms thick making it difficult to produce capacitors with large capacitance in highly integrated devices. Using the method of the present invention, however, thinner dielectric layers can be used because damage during the sputter etch step is reduced. Accordingly, capacitors formed according to the present invention can provide increased capacitance as well as high levels of integration.

A metallic layer is then deposited on the second capacitor electrode 122, the dielectric layer 120, and the exposed portions of the first wiring electrode 112b, after the sputter etch step has been completed. This metallic layer can include aluminum, an aluminum alloy, copper, or a copper alloy. The metallic layer is then patterned using photolithography and etch steps to form the capacitor protection layer 126a and the second wiring electrode 126b, and the capacitor protection layer 126a can provide protection for the upper capacitor electrode 122. As shown, the upper capacitor electrode 122 is enclosed by the capacitor protection layer 126a so that hillock formation and corrosion are reduced. In addition, a metallic protection layer (a second conductive layer) 128 can be formed on the capacitor protection layer 126a and the second wiring electrode 126b to further reduce hillock formation.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for forming an integrated circuit device including a capacitor, said method comprising the steps of:

forming a first capacitor electrode on a substrate;

forming a first wiring electrode on said substrate;

forming an insulating layer on said first capacitor electrode and on said first wiring electrode opposite said substrate;

forming a second capacitor electrode on a portion of said insulating layer opposite said first capacitor electrode;

after said step of forming said second capacitor electrode, forming a contact hole in said insulating layer exposing a portion of said first wiring electrode; and after said steps of forming said second capacitor electrode and forming said contact hole, forming a second wiring electrode on said exposed portion of said first wiring electrode.

2. A method according to claim 1 wherein said steps of forming said first capacitor electrode and forming said first wiring electrode are performed simultaneously.

3. A method for forming an integrated circuit device including a capacitor, said method comprising the steps of:

forming a first capacitor electrode on a substrate;

forming a first wiring electrode on said substrate;

forming an insulating layer on said first capacitor electrode and on said first wiring electrode opposite said substrate;

forming a second capacitor electrode on a portion of said insulating layer opposite said first capacitor electrode;

forming a contact hole in said insulating layer exposing a portion of said first wiring electrode;

removing a natural oxide from said exposed portion of said first wiring electrode after forming said second capacitor electrode; and after said steps of forming said second capacitor electrode and removing said natural oxide, forming a second wiring electrode on said exposed portion of said first wiring electrode.

4. A method according to claim 3 wherein said step of removing said natural oxide from said exposed portion of said first wiring electrode comprises performing a sputter etch.

5. A method according to claim 4 wherein said sputter etch is performed using an inert gas.

6. A method according to claim 5 wherein said inert gas comprises Argon.

7. A method for forming an integrated circuit device including a capacitor, said method comprising the steps of:

forming a first capacitor electrode on a substrate;

forming a first wiring electrode on said substrate;

forming an insulating layer on said first capacitor electrode and on said first wiring electrode opposite said substrate;

forming a second capacitor electrode on a portion of said insulating layer opposite said first capacitor electrode;

forming a contact hole in said insulating layer exposing a portion of said first wiring electrode; and after said step of forming said second capacitor electrode, forming a second wiring electrode on said exposed portion of said first wiring electrode wherein said step of forming said second wiring electrode further comprises simultaneously forming a protective layer on said second capacitor electrode opposite said insulating layer.

8. A method according to claim 7 further comprising the step of forming conductive layers on said second wiring electrode and on said protective layer.

9. A method according to claim 8 wherein said conductive layers comprise titanium nitride.

10. A method according to claim 7 wherein said protective layer covers exposed portions of said second capacitor electrode.

11. A method for forming an integrated circuit device including a capacitor, said method comprising the steps of:

forming a first capacitor electrode on a substrate;

forming a first wiring electrode on said substrate;

forming a hillock reducing layer on said first capacitor electrode and on said first wiring electrode opposite said substrate;

after said step of forming said hillock reducing layer, forming an insulating layer on said first capacitor electrode and on said first wiring electrode opposite said substrate;

forming a second capacitor electrode on a portion of said insulating layer opposite said first capacitor electrode;

forming a contact hole in said insulating layer exposing a portion of said first wiring electrode; and after said step of forming said second capacitor electrode, forming a second wiring electrode on said exposed portion of said first wiring electrode.

12. A method according to claim 11 wherein said hillock reducing layer comprises titanium nitride.

13. A method according to claim 11 wherein said first capacitor electrode and said first wiring electrode each comprise a metal.

14. A method according to claim 1 wherein said step of forming said insulating layer comprises forming a first insulating sub-layer on said first capacitor electrode and on said first wiring electrode opposite said substrate, forming a contact hole in said first insulating sub-layer exposing a portion of said first capacitor electrode, and forming a second insulating sub-layer on said exposed portion of said first capacitor electrode.

15. A method according to claim 14 wherein said second insulating sub-layer has a thickness in the range of 500 Angstroms to 1000 Angstroms.

16. A method according to claim 14 wherein said second insulating sub-layer comprises a material chosen from the group consisting of silicon oxide and silicon nitride.

17. A method according to claim 1 wherein said step of forming s aid contact hole comprises performing a wet etch on said insulating layer.

18. A method according to claim 1 wherein said step of forming said contact hole comprises performing a dry etch on said insulating layer.

19. A method for forming an integrated circuit device including a capacitor, said method comprising the steps of:

forming a first capacitor electrode on a substrate;

forming a first wiring electrode on said substrate;

forming an insulating layer on said first capacitor electrode and on said first wiring electrode opposite said substrate;

forming a second capacitor electrode on a portion of said insulating layer opposite said first capacitor electrode;

forming a contact hole in said insulating layer exposing a portion of said first wiring electrode; and after said step of forming said second capacitor electrode, forming a second wiring electrode on said exposed portion of said first wiring electrode;

wherein said first capacitor electrode and said second wiring electrode are at least as thick as said second capacitor electrode.

20. A method according to claim 1 wherein said second capacitor electrode has a thickness in the range of 500 Angstroms to 6000 Angstroms.

* * * * *